(12) United States Patent
Müller et al.

(10) Patent No.: US 8,853,732 B2
(45) Date of Patent: Oct. 7, 2014

(54) OPTOELECTRONIC COMPONENT

(75) Inventors: Klaus Müller, Pettendorf (DE); Günter Spath, Regensburg (DE); Siegfried Herrmann, Neukirchen (DE); Ewald Karl Michael Günther, Regenstauf (DE); Herbert Brunner, Sinzing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 93 days.

(21) Appl. No.: 13/499,622

(22) PCT Filed: Aug. 31, 2010

(86) PCT No.: PCT/EP2010/062733
§ 371 (c)(1),
(2), (4) Date: Jun. 13, 2012

(87) PCT Pub. No.: WO2011/039023
PCT Pub. Date: Apr. 7, 2011

(65) Prior Publication Data
US 2012/0248492 A1 Oct. 4, 2012

(30) Foreign Application Priority Data

Sep. 30, 2009 (DE) .......................... 10 2009 047 878
Nov. 3, 2009 (DE) .......................... 10 2009 051 746

(51) Int. Cl.
*H01L 33/62* (2010.01)
*H01L 31/0224* (2006.01)
(52) U.S. Cl.
CPC ............ *H01L 33/62* (2013.01); *H01L 31/0224* (2013.01)

USPC .............. 257/99; 257/E33.066; 257/E31.124; 257/E23.023; 438/26; 438/64
(58) Field of Classification Search
CPC ........ H01L 33/486; H01L 33/52; H01L 33/62
USPC .................... 257/99, 433, E33.056, E33.066, 257/E31.124, E23.023, E23.049, 100; 438/26, 64
See application file for complete search history.

(56) References Cited

U.S. PATENT DOCUMENTS 7,265,392 B2    9/2007  Hahn et al.
7,329,905 B2 *  2/2008  Ibbetson et al. ................ 257/98

(Continued)

FOREIGN PATENT DOCUMENTS

CN    1761079      4/2006
DE    10233050     2/2004

(Continued)

*Primary Examiner* — Allan R Wilson
(74) *Attorney, Agent, or Firm* — Cozen O'Connor

(57) ABSTRACT

The invention relates to an optoelectronic component, having —a carrier (1) comprising a first main surface (Ia), —at least one optoelectronic semiconductor chip (2) having no substrate, and —a contact metallization (3a, 3b), wherein —the carrier (1) is electrically insulating, —the at least one optoelectronic semiconductor chip (2) is fastened to the first main surface (Ia) of the carrier (1) by means of a bonding material (4), particularly a solder material, —the contact metallization (3a, 3b) covers at least one area of the first main surface (Ia) free of the optoelectronic semiconductor chip (2), and —the contact metallization (3a, 3b) is electrically conductively connected to the optoelectronic semiconductor chip (2).

16 Claims, 7 Drawing Sheets

(56) References Cited

U.S. PATENT DOCUMENTS

| | | | |
|---|---|---|---|
| 7,453,092 B2 | 11/2008 | Suehiro et al. | |
| 7,838,878 B2 * | 11/2010 | Greisen | 257/48 |
| 2005/0082974 A1 * | 4/2005 | Fukasawa et al. | 313/512 |
| 2006/0043402 A1 | 3/2006 | Suehiro et al. | |
| 2007/0221935 A1 | 9/2007 | Tseng et al. | |
| 2007/0272940 A1 | 11/2007 | Lee et al. | |
| 2008/0035942 A1 | 2/2008 | Kim et al. | |
| 2008/0102541 A1 | 5/2008 | Kang et al. | |
| 2008/0135869 A1 * | 6/2008 | Liu et al. | 257/99 |
| 2008/0258168 A1 | 10/2008 | Loh et al. | |
| 2008/0297644 A1 | 12/2008 | Farchtchian et al. | |
| 2010/0171135 A1 | 7/2010 | Engl et al. | |
| 2010/0181589 A1 * | 7/2010 | Huang et al. | 257/98 |
| 2010/0276706 A1 | 11/2010 | Herrmann | |
| 2010/0308452 A1 * | 12/2010 | Iihola et al. | 257/692 |
| 2012/0061717 A1 * | 3/2012 | Lee et al. | 257/99 |
| 2012/0322178 A1 * | 12/2012 | Guenther et al. | 438/26 |
| 2013/0049048 A1 * | 2/2013 | Takeda et al. | 257/98 |

FOREIGN PATENT DOCUMENTS

| | | |
|---|---|---|
| DE | 102007022947 | 10/2008 |
| JP | 2002-335020 | 11/2002 |
| JP | 2003-078170 | 3/2003 |
| JP | 2004-363279 | 12/2004 |
| JP | 2006-344971 | 12/2006 |
| JP | 2008-294224 | 12/2008 |
| JP | 2009-049267 | 3/2009 |
| WO | WO2006/054616 | 5/2006 |

* cited by examiner

OPTOELECTRONIC COMPONENT

RELATED APPLICATION

This is a U.S. national stage of application No. PCT/EP2010/062733, filed on Aug. 31, 2010. Priority is claimed on the following applications: German Application No.: 10 2009 047 878.7 filed on Sep. 30, 2009 and German Application No.: 10 2009 051 746.4 filed on Nov. 3, 2009, the disclosure contents of both of which are hereby incorporated herein by reference.

FIELD OF THE INVENTION

An optoelectronic component is specified. Furthermore, an optoelectronic device comprising such an optoelectronic component is specified. A method for producing an optoelectronic component is furthermore specified.

BACKGROUND OF THE INVENTION

The document DE 10 2007 022 947 A1 describes an optoelectronic semiconductor body.

SUMMARY OF THE INVENTION

One object of the invention is to provide an optoelectronic component whose size can be scaled in a particularly simple manner.

The optoelectronic component described here is, for example, a light emitting diode or a radiation detector.

In accordance with at least one embodiment of the optoelectronic component, the optoelectronic component comprises a carrier. The carrier can have any desired form and is configured in the manner of a parallelepiped, for example. The carrier is sufficiently mechanically stable to carry and mechanically support at least one semiconductor chip. For this purpose, the carrier can be embodied, for example, as a solid body composed of a rigid material or else as a film. The carrier has a first main area, which extends, for example, along a main extension direction of the carrier.

In accordance with at least one embodiment of the optoelectronic component, the component comprises at least one substrateless optoelectronic semiconductor chip. In this case, "substrateless" means that the optoelectronic semiconductor chip comprises, for example, an epitaxially produced layer sequence provided for generating or detecting electromagnetic radiation during operation. A growth substrate is removed from the epitaxially produced layer sequence of the semiconductor chip. In this way, an optoelectronic semiconductor chip is realized which is free of a growth substrate and thus substrateless. It preferably has a thickness of less than 20 μm, for example a thickness of between 2 μm and 6 μm inclusive. The substrateless optoelectronic semiconductor chip can be, for example, a light emitting diode chip, a laser diode chip or a photodetector chip.

In accordance with at least one embodiment of the optoelectronic component, the optoelectronic component comprise's a contact metallization. The contact metallization is provided for making contact with the at least one optoelectronic semiconductor chip. The contact metallization contains or consists of, for example, at least one of the following metals: gold, platinum, silver, aluminum. The metals for forming the contact metallization are applied to at least parts of the carrier for example by means of vapor deposition and are subsequently patterned to form a contact metallization, for example using photolithographic methods.

In accordance with at least one embodiment of the optoelectronic component, the carrier is embodied in an electrically insulating fashion. For this purpose, the carrier preferably consists of an electrically insulating or electrically poorly conducting material. The carrier contains, for example, one of the following materials or consists of one of the following materials: ceramic, silicon, plastic. If the carrier is formed with a ceramic material, then the carrier can contain, for example, Al2O3, AlN and/or BN (for example polycrystalline cubic boron nitride, PCBN) or consist of one of said materials.

In accordance with at least one embodiment of the optoelectronic component, the optoelectronic semiconductor chip is fixed to the first main area of the carrier by means of a connecting material. By way of example, the optoelectronic semiconductor chip is then also electrically conductively connected to the contact metallization of the optoelectronic component by means of the connecting material. The optoelectronic semiconductor chip can be mechanically connected to the carrier for example by means of a solder material arranged between the optoelectronic semiconductor chip and the first main area of the carrier. In other words, the optoelectronic semiconductor chip can be soldered onto the carrier at the first main area.

In accordance with at least one embodiment of the optoelectronic component, the contact metallization covers at least one region of the first main area of the carrier which is free of the optoelectronic semiconductor chip. That is to say that on the first main area of the carrier, locations which are not covered by the optoelectronic semiconductor chip are covered by the contact metallization. In other words, the carrier, at least in a direction parallel to the first main area, that is to say in a lateral direction, has a larger extent than the optoelectronic semiconductor chip or chips fixed to the first main area on the carrier. The carrier can therefore have a different, preferably a larger, extent than the chip in lateral directions. The effective area of the chip is thus enlarged by means of the carrier, which can facilitate the handling of the optoelectronic semiconductor chip. The additional area can be utilized for example for the contact metallization to which the optoelectronic semiconductor chip is preferably electrically conductively connected. The contact metallization can then serve for the external electrical connection of the optoelectronic semiconductor chip. By way of example, the contact metallization can be electrically conductively connected to component connections or external connection locations of the component.

In accordance with at least one embodiment of the optoelectronic component, the component comprises a carrier having a first main area, at least one substrateless optoelectronic semiconductor chip and a contact metallization. In this case, the carrier is embodied in an electrically insulating fashion, and the at least one optoelectronic semiconductor chip is fixed to the first main area of the carrier by means of a connecting material, in particular a solder material. The contact metallization covers at least one region of the first main area which is free of the optoelectronic semiconductor chip, and is electrically conductively connected to the optoelectronic semiconductor chip.

The optoelectronic component described here has in this case the following advantages, inter alia: the substrateless optoelectronic semiconductor chip can be thermally linked particularly well via the carrier, since the carrier enlarges for example an area at which a thermal linking is effected. Furthermore, the carrier itself can serve as a heat sink for taking up the heat generated during the operation of the semiconductor chip. By means of the configuration of the carrier, it is furthermore possible for the outer dimensions of the optoelectronic component to be configured relatively freely, that is to say in the maximum dimensioning independently of the size of the substrateless optoelectronic semiconductor chips used. The size of the optoelectronic component is therefore scalable. By means of applying a plurality of substrateless optoelectronic semiconductor chips on a carrier, it is possible to create an optoelectronic component which has a particularly large radiation passage area through which electromagnetic radiation exits from the component or enters into the latter. The optoelectronic component itself can in turn be incorporated in the manner of a conventional optoelectronic semiconductor chip for example in a prefabricated housing base body or itself forms a, for example surface-mountable, optoelectronic device. The use of a carrier for the at least one substrateless optoelectronic semiconductor chip furthermore makes it possible to integrate additional electrical and electronic functions into the optoelectronic component by integration into the carrier. Thus, the carrier can comprise, for example, resistance elements, ESD protection elements or drive circuits. In this case, it is also possible, in particular, for the carrier itself to be an integrated circuit for driving the at least one substrateless optoelectronic semiconductor chip. By way of example, the carrier is then a CMOS chip, on which the at least one substrateless optoelectronic semiconductor chip is fixed and electrically connected. The CMOS chip can then be used for driving the optoelectronic semiconductor chip. The use of a substrateless optoelectronic semiconductor chip in the optoelectronic component furthermore makes it possible to create a particularly flat optoelectronic component which, on account of the use of a carrier, nevertheless has a sufficient mechanical stability. The optoelectronic component described here can be used in the manner of a conventional optoelectronic semiconductor chip in different types of housing that are already commercially available. Finally, the optoelectronic component described here makes it possible to integrate substrateless optoelectronic semiconductor chips of the same type into one and the same component. By way of example, the substrateless optoelectronic semiconductor chips used can be substrateless light emitting diode chips which, by way of example, generate electromagnetic radiation having the same peak wavelength with a tolerance of less than 2 nm during operation. Furthermore, the substrateless light emitting diode chips can then emit electromagnetic radiation having the same intensity with a tolerance of, for example, at most 10% with the same energization. In other words, therefore, presorted semiconductor chips of the same type can be used on the carrier. This enables optoelectronic components having, for example, a particularly large emission area that appears homogeneous.

In accordance with at least one embodiment of the optoelectronic component, at least two contact metallizations cover a region of the first main area which is free of the optoelectronic semiconductor chip. At least one of the contact metallizations then serves for the n-side connection of the optoelectronic semiconductor chip, and another of the contact metallizations then serves for the p-side connection of the optoelectronic semiconductor chip.

In accordance with at least one embodiment of the optoelectronic component, the latter comprises a reflective potting material. Reflective means that the potting material has a reflectivity of, in particular, more than 80% or of more than 90%, preferably of more than 94%, for radiation in the visible spectral range. The potting material preferably reflects diffusely. To an observer, the potting material preferably appears white.

In accordance with at least one embodiment of the optoelectronic component, the reflective potting material surrounds the optoelectronic semiconductor chip all around in a lateral direction. In particular, the potting material is in direct contact with the optoelectronic semiconductor chip all around at least in places. By way of example, the reflective potting material completely covers the first main area of the carrier, wherein only the top side of the optoelectronic semiconductor chip facing away from the carrier is free of the reflective potting material. In this case, the reflective potting material preferably also completely covers the contact metallization, such that the latter is not discernible in a plan view of the carrier.

The reflective potting material is preferably a polymer into which particles having a reflective action are filled. The polymer of the potting material, which forms a matrix for the particles, is for example a silicone, an epoxide or a silicone-epoxide hybrid material. The reflective particles are produced, for example, from a metal oxide such as aluminum oxide or titanium oxide, from a metal fluoride such as calcium fluoride or from a silicon oxide or consist thereof. An average diameter of the particles, for example a median diameter $d_{50}$ in $Q_0$, is preferably between 0.3 µm and 5 µm inclusive. A proportion by weight of the particles in the entire potting material is preferably between 5% and 50% inclusive, in particular between 10% and 30% inclusive. The particles have a reflective action on account of their preferably white color and/or on account of their difference in refractive index with respect to the matrix material.

In accordance with at least one embodiment of the optoelectronic component, the carrier has at least one opening which extends from the first main area through the carrier to a second main area lying opposite the first main area. The opening is embodied, for example, as a hole or perforation in the material of the carrier. The opening is filled at least in places with an electrically conductive material, which is introduced into the opening in such a way that an electrically conductive path extends by means of the electrically conductive material through the opening from the second main area to the first main area of the carrier. For this purpose, the opening can be coated with the electrically conductive material at inner areas facing the carrier. However, it is also conceivable for the entire opening to be filled with the electrically conductive material.

In this case, the electrically conductive material is preferably connected to the contact metallization of the optoelectronic component, such that electrical contact can be made with the at least one substrateless optoelectronic semiconductor chip by means of the electrically conductive material in the opening.

In accordance with at least one embodiment of the optoelectronic component, at least one of the openings is completely surrounded by the carrier in a lateral direction, that is to say in directions parallel to the first main area of the carrier. In other words, the opening extends within the carrier and has at least approximately the form of a three-dimensional body such as a cylinder, a truncated cone or a parallelepiped. The electrically conductive material in the opening then adjoins the carrier. In this way, the electrically conductive material in the opening is protected against external influences by the carrier.

In accordance with at least one embodiment of the optoelectronic component, the electrically conductive material in at least one opening is free from the carrier in places in a lateral direction. In this case, the opening is not completely surrounded by the carrier for example in a lateral direction, but rather is outwardly open. The opening then has, for example, the form of a semicylinder or of a quarter-cylinder. Such an opening can be effected, for example, by severing the carrier through the opening. The optoelectronic component can then have at the edge plated-through holes which can be wetted with a connection material.

In this way, a solder meniscus can be formed for example during the SMT mounting of the optoelectronic component in the region of the opening.

It is also possible in this case for the optoelectronic component to have at least one opening which is completely surrounded by the carrier in a lateral direction and at least one opening in which the electrically conductive material is accessible in places in a lateral direction.

In accordance with at least one embodiment of the optoelectronic component, at least one component connection is arranged at the second main area of the carrier. The component connection is electrically conductively connected to the electrically conductive material in at least one opening. The contact metallization and thus the optoelectronic semiconductor chip can then be electrically connected via the component connection and the electrically conductive material in the opening. By way of example, the optoelectronic component comprises at least two component connections at the second main area of the carrier. The optoelectronic component can then be a surface-mountable optoelectronic component which, without the use of an additional device housing, per se already constitutes an optoelectronic device such as a light emitting diode, for example.

In accordance with at least one embodiment of the optoelectronic component, the optoelectronic component comprises at least two optoelectronic semiconductor chips of identical type which are fixed to the first main area of the carrier. By way of example, the optoelectronic semiconductor chips which are embodied such that they are of the same type are light emitting diodes which are embodied such that they are of the same type and which emit electromagnetic radiation having the same intensity and the same wavelength within a specific tolerance. Furthermore, the optoelectronic component comprises at least one conversion element which covers the optoelectronic semiconductor chips of identical type at their side facing away from the first main area. The conversion element is, for example, a phosphor introduced into a matrix material. Furthermore, the conversion element can be a lamina formed from a ceramic phosphor. Since the optoelectronic semiconductor chips are constructed such that they are of the same type, a single conversion element can be used for covering the optoelectronic semiconductor chips constructed such that they are of the same type. The mixed light composed, for example, of the light emitted by the optoelectronic semiconductor chips and the light wavelength-converted by the conversion element is emitted homogeneously without fluctuations in the color locus or color temperature or intensity of the emitted mixed light being discernible between different optoelectronic semiconductor chips.

In this case, it is possible for the reflective potting compound to cover side areas of the conversion element, such that only the top side facing away from the optoelectronic semiconductor chip is free of the reflective potting compound. In this case, the potting compound can also cover the first main area of the carrier in places or completely. The remaining outer area of the carrier can be free of the potting compound.

In accordance with at least one embodiment of the optoelectronic component, the conversion element in this case also covers an interspace between two adjacent optoelectronic semiconductor chips of identical type. In this case, the conversion element can be used to the effect that the interspaces between two adjacent optoelectronic semiconductor chips of identical type which appear dark in the case of radiation-emitting semiconductor chips can hardly be discerned or can no longer be discerned at all as dark locations in the radiation exit area of the optoelectronic component.

In accordance with at least one embodiment of the optoelectronic component, the component comprises a potting body, which molds around the optoelectronic semiconductor chip at least in places, wherein the potting body adjoins the first main area of the carrier, and at least one side area of the potting body terminates flush with at least one side area of the carrier. By way of example, all the side areas of the potting body terminate flush with the assigned side areas of the carrier. That is to say that the potting body does not project beyond the carrier in a lateral direction, and vice-versa. By way of example, the potting body can be applied to the carrier, as long as the latter is present in a carrier assemblage comprising a multiplicity of carriers. During the singulation of the carrier assemblage into individual carriers, singulation is then also effected through the potting body, such that the side areas of potting body and carrier are produced in the same method step. The potting body then has traces of singulation, such as sawing grooves, for example, at its side areas. The carrier, too, can then have traces of singulation, such as sawing grooves, for example, at its side areas. The potting body can be shaped in places in the manner of a lens, for example, such that it can serve for the beam shaping of the electromagnetic radiation from the optoelectronic semiconductor chip during operation. By way of example, the potting body is formed with a silicone material, an epoxy material or a silicone-epoxide hybrid material.

An optoelectronic device is furthermore specified. The optoelectronic device comprises a housing base body. The housing base body can, for example, be formed by a printed circuit board or comprise a printed circuit board. Furthermore, it is possible for the housing base body to be formed with a ceramic material or a plastic material, into which a cavity for receiving an optoelectronic component is introduced. In any case, the optoelectronic device comprises at least one optoelectronic component as described in at least one of the embodiments mentioned above. In this case, the optoelectronic component is fixed in or to the housing base body. By way of example, the optoelectronic component can additionally be electrically conductively connected electrically conductively to parts of the housing base body or electrical connection locations which are fixed in or to the housing base body.

In accordance with at least one embodiment of the optoelectronic component, a potting body is molded around the optoelectronic component at least in places, wherein the potting body adjoins the carrier, the optoelectronic semiconductor chip and the housing base body. By way of example, the optoelectronic component is introduced into a cavity in the housing base body. The optoelectronic component can then be potted in said cavity with a radiation-transmissive potting material which forms the potting body. That is to say that the optoelectronic component with the carrier and the at least one optoelectronic semiconductor chip on the carrier is fixed in the manner of a conventional optoelectronic semiconductor chip in a housing base body and potted with a potting body. In this way, housing base bodies that are known and already commercially available can be used for the optoelectronic component described here.

Furthermore, a method for producing an optoelectronic component is specified. By way of example, an optoelectronic component described here can be produced by means of the method described here. That is to say that all the features described for the optoelectronic component are also disclosed for the method, and vice-versa.

In accordance with at least one embodiment of the method, the method comprises a step in which a carrier assemblage comprising a multiplicity of carriers is provided. By way of example, the carrier assemblage is a large disk composed of the material from which the carriers are formed. For example, a large disk composed of a ceramic material, composed of silicon, composed of plastic or a film can be involved.

In accordance with at least one embodiment of the method, a multiplicity of optoelectronic semiconductor chips arranged on a substrate are furthermore provided. In this case, the semiconductor chips can be present on the substrate as a continuous active layer sequence, that is to say that they have not yet been singulated to form individual chips. The substrate can be, for example, the growth substrate onto which the optoelectronic semiconductor chips, that is to say the active layer sequence, are deposited epitaxially.

In accordance with at least one embodiment of the method, the optoelectronic semiconductor chips are detached from the substrate. In this case, the detachment can be effected before or after singulation of the active layer sequence to form individual optoelectronic semiconductor chips. That is to say that, during detachment, the optoelectronic semiconductor chips can still be present in an assemblage with a multiplicity of optoelectronic semiconductor chips. The detachment can take place by means of a laser lift-off method, for example.

In accordance with at least one embodiment of the method, at least one of the optoelectronic semiconductor chips is applied to at least one of the carriers of the carrier assemblage and fixed. This can be done by means of solder mounting, for example. That is to say that at least one optoelectronic semiconductor chip is soldered onto at least one carrier of the carrier assemblage.

In accordance with at least one embodiment of the method, a functional check with operation of the optoelectronic semiconductor chip is carried out before the optoelectronic semiconductor chip is applied on the carrier. That is to say that the optoelectronic semiconductor chip is operated for example for generating electromagnetic radiation. In this case, the electromagnetic radiation generated can be measured. A non-functioning optoelectronic semiconductor chip is not fixed on a carrier of the carrier assemblage, such that no carrier is occupied by a functionally incapable semiconductor chip. Furthermore, the optoelectronic semiconductor chips can be applied to the carriers of the carrier assemblage in a presorted fashion. That is to say that, for example, optoelectronic semiconductor chips of identical type can be applied to adjacent carriers of the carrier assemblage or to the same carrier of the carrier assemblage. Therefore, the optoelectronic semiconductor chips can already be presorted before the completion of the optoelectronic component.

In accordance with at least one embodiment of the method, the optoelectronic semiconductor chips are applied to an auxiliary carrier before being applied to a carrier of the carrier assemblage. The functional check can then be carried out on the auxiliary carrier. In this case, the optoelectronic semiconductor chips are preferably fixed on the auxiliary carrier in such a way that they can be released again from the auxiliary carrier in a nondestructive manner. After being released from the auxiliary carrier, the optoelectronic semiconductor chips are then fixed, if appropriate, on a carrier of the carrier assemblage. Semiconductor chips which do not function in the range of predeterminable parameters remain on the auxiliary carrier, with the result that expensive carrier material is not consumed. In this way, the yield of functionally capable semiconductor chips affects the costs of the component to a lesser extent.

After optoelectronic semiconductor chips have been applied to the carriers of the carrier assemblage, the latter can be singulated into individual components. This can be effected, for example, using different methods than is the case for the singulation of optoelectronic semiconductor chips, since the singulation of the semiconductor chips and the singulation of the carrier assemblage are decoupled from one another. By way of example, it is possible to use particularly efficient methods for singulating the carrier assemblage such as "stealth dicing" or "dicing by grinding", thereby increasing the throughput in the production of the optoelectronic semiconductor component and/or the area utilization.

In accordance with at least one embodiment of the method, a metallization is applied to a first main area of at least one carrier of the carrier assemblage. In this case, the metallization can be applied before or after an optoelectronic semiconductor chip is applied to the carrier. Furthermore, it is possible for one portion of the metallization to be applied before the semiconductor chip is applied, and another portion of the metallization to be applied after the semiconductor chip is applied. The metallization is patterned after application to form a contact metallization using a photolithographic method. That is to say that, by way of example, two regions of the metallization which are electrically isolated from one another are produced on the first main area of the carrier, by means of which the radiation-emitting semiconductor chip can be contact-connected on the n- and p-sides.

BRIEF DESCRIPTION OF THE DRAWINGS

The optoelectronic component described here, the optoelectronic device described here and the method described here for producing an optoelectronic component are explained in greater detail below on the basis of exemplary embodiments and the associated figures.

With reference to the schematic perspective illustrations in FIGS. 1, 2, 3, 4 and 9, exemplary embodiments of an optoelectronic component described here are explained in greater detail.

Figure 5:
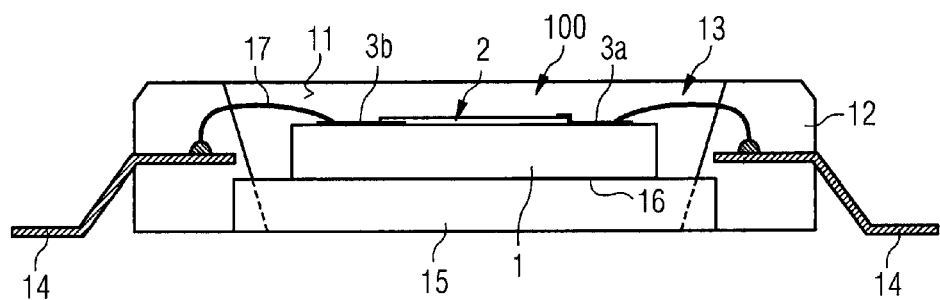
Figure 6:
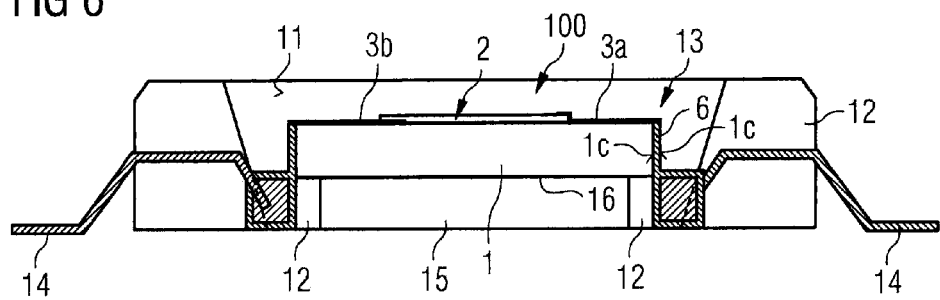

On the basis of the schematic sectional illustrations in FIGS. 5 and 6, exemplary embodiments of a device described here are explained in greater detail.

With reference to FIGS. 7A, 7B, 7C, 7D, process sequences for producing an optoelectronic component in accordance with a method described here are explained in greater detail.

With reference to FIGS. 8A, 8B, 8C, 8D, in schematic sectional illustrations, method steps for producing an optoelectronic component described here are explained in greater detail.

Elements which are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF THE DRAWINGS

Figure 1:
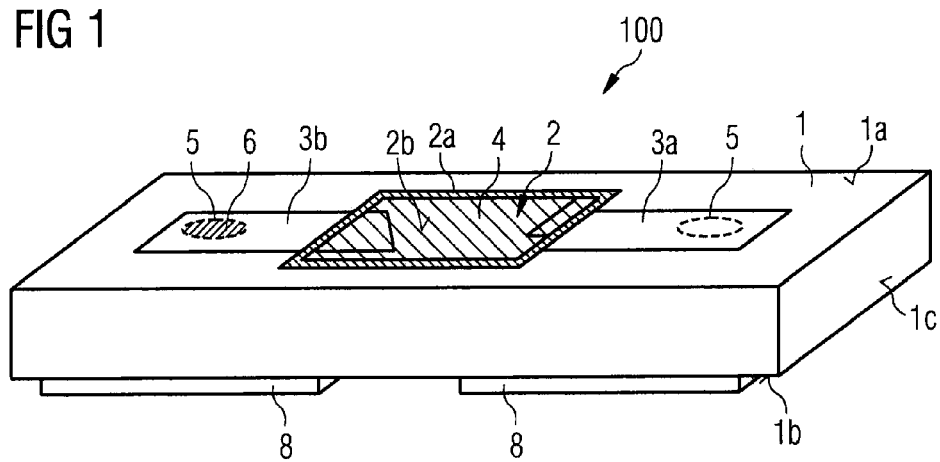

FIG. 1 shows an exemplary embodiment of an optoelectronic component described here in a schematic perspective illustration. The optoelectronic component 100 comprises a carrier 1. In the present case, the carrier 1 is embodied in the form of a parallelepiped. The carrier 1 is, for example, a solid body formed from a plastic, a silicon or a ceramic material. The carrier 1 comprises a first main area 1a and an opposite second main area 1b. Furthermore, the carrier 1 comprises side areas 1c connecting the first main area 1a and the second main area 1b to one another.

The optoelectronic component 100 furthermore comprises a substrateless optoelectronic semiconductor chip 2. In the present case, the semiconductor chip 2 is a substrateless light emitting diode. The substrateless light emitting diode 2 is fixed by means of a connecting material 4, for example by means of a solder material, at the first main area 1a on the carrier 1. By its side facing the carrier 1, the semiconductor chip 2 is electrically conductively connected to the contact metallization 3b. At its side facing away from the carrier 1, the semiconductor chip 2 is electrically conductively connected to the contact metallization 3a. The semiconductor chip 2 comprises, for example, an electrically conductive contact frame 2a, which laterally surrounds a radiation passage area 2b of the semiconductor chip 2. The contact metallization 3a is electrically conductively connected to said contact frame 2a.

The contact metallizations 3a, 3b are applied to the first main area 1a of the carrier. By way of example, the contact metallizations 3a, 3b, for the production thereof, are applied, for example by vapor deposition, over a large area onto the first main area 1a of the carrier and are subsequently patterned photolithographically.

The optoelectronic component 100 furthermore comprises openings 5 penetrating through the carrier 1 from the first main area 1a to the second main area 1b. In the present case, the openings 5 are embodied in the form of cylinders. One opening 5 is present per contact metallization 3a, 3b. An electrically conductive material 6, for example a metal, is introduced into each of the openings 5 and imparts an electrically conductive connection between the contact metallizations 3a, 3b and component connections 8 formed at the second main area 1b of the carrier 1. In this case the openings 5 can be completely filled with the electrically conductive material 6. Furthermore, it is possible for only the inner areas of the openings 5 that face the carrier 1 to be coated with the electrically conductive material 6, for example a metal.

Overall, an optoelectronic component 100 which is surface-mountable is specified in this way. The optoelectronic component can be mounted into a housing base body in order to produce an optoelectronic device (in this respect, cf. FIGS. 5 and 6, for example). Furthermore, it is possible for the optoelectronic component itself to be used in the manner of an optoelectronic device and for no further housing or encapsulation of the component 100 to be effected.

Figure 2:
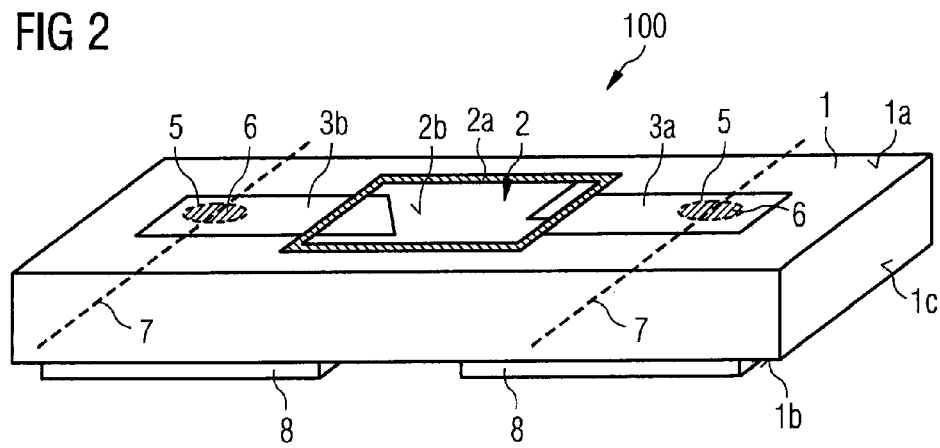

In conjunction with FIG. 2, a further exemplary embodiment of an optoelectronic component 100 described here is explained in greater detail. In contrast to the exemplary embodiment in FIG. 1, the carrier is severed along the cutting lines 7. That is to say that, during the singulation of a carrier assemblage, for example, singulation is effected through the openings 5, such that electrically conductive material 6 in the openings 5 is freely accessible from a side area is of the carrier 1. In this way, the plated-through holes formed by the openings 5 can be wetted. A solder meniscus forms during the solder mounting of the optoelectronic component 100, which meniscus can extend in the region of the electrically conductive material 6 in the openings 5 at the side area is of the carrier 1. This serves firstly for improved contact-connection of the optoelectronic component 100, and secondly it is possible in this way to check optically whether a reliable solder connection of the component is present, since it can be assumed that if wetting is present at the side areas, the component connections 8 are also wetted with the solder material.

Figure 3:
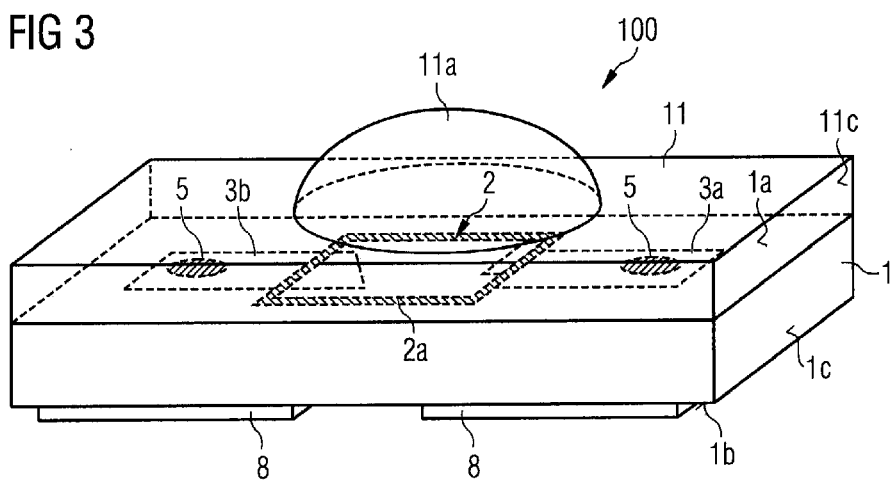

In conjunction with FIG. 3, a further exemplary embodiment of an optoelectronic component 100 described here is explained in greater detail, in which, in contrast to the component in FIG. 1, a potting body 11 is present, which is situated in direct contact with the semiconductor chip 2 and the carrier 1 at the first main area 1a thereof. The potting body 11 can apply, for example, if the carrier 1 is still present in a carrier assemblage. During the singulation of the carrier assemblage to form individual carriers 1, the potting body is then also concomitantly singulated. In this way, side areas 11c of the potting body 11 and side areas 1c of the carrier 1 terminate flush with one another. Both side areas 1c, 11c have traces of the singulation process, for example fracture traces or sawing grooves.

The potting body 11 can furthermore have a region which is embodied as a lens 11a and serves, for example, for beam shaping or increases the probability of radiation emerging from the optoelectronic component 100. The potting body is formed with a silicone, for example, and can contain diffusely scattering particles and/or particles of a luminescence conversion material (respectively not illustrated).

Figure 4:
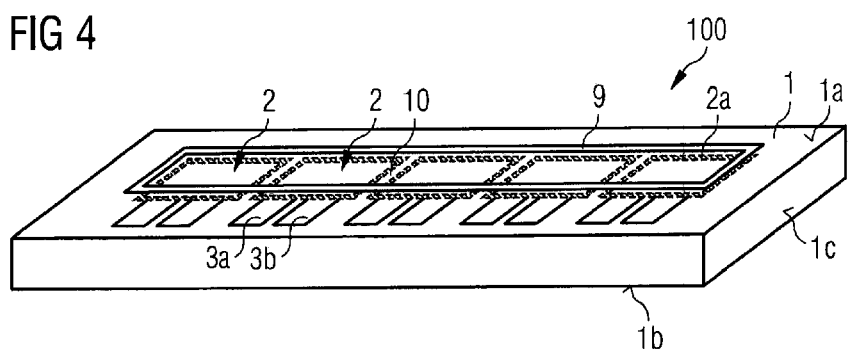

In conjunction with FIG. 4, a further exemplary embodiment of an optoelectronic component described here is explained in greater detail. In this exemplary embodiment, the optoelectronic component 100 comprises a plurality of, in the present case five, substrateless optoelectronic semiconductor chips 2. Each of the optoelectronic semiconductor chips 2 can be electrically conductively connected via a pair of contact metallizations 3a, 3b. Furthermore, it is also possible for the optoelectronic semiconductor chips 2 to be connected in series. It is furthermore also possible for openings 5 for forming plated-through holes to be present, via which the optoelectronic semiconductor chips 2 can be electrically contact-connected from the second main area 1b via component connections 8.

In the present case, the optoelectronic semiconductor chips 2 are, for example, substrateless light emitting diodes of identical type. The semiconductor chips 2, after a functional check, are applied to the carrier 1 in a targeted manner. In this case, such semiconductor chips 2 are applied to the same carrier 1 which correspond in terms of their physical properties such as peak wavelength of the emitted light and intensity of the emitted light so well that they can be covered with a common converter layer 9. The component 100 then has an emission area formed by that side of the conversion element 9 which faces away from the carrier 1, and from which light is emitted homogeneously. The conversion element can be, for example, a matrix material or a film into which particles of a luminescence conversion material are introduced. Furthermore, it is possible for the conversion element 9 to be formed by a lamina consisting of a ceramic luminescence conversion material. In this case, the conversion element 9 also covers interspaces 10 between adjacent semiconductor chips 2.

In conjunction with the schematic sectional illustration in FIG. 5, a first exemplary embodiment of an optoelectronic device described here is explained in greater detail. The optoelectronic device comprises a housing base body 12. The housing base body 12 is formed, for example, with a plastic material or a ceramic material. The housing base body 12 has a cavity 3 provided for receiving an optoelectronic component 100 described here. In the present case, the optoelectronic component 100 is applied to a potential-free heat sink 15 having a low thermal resistance. In this case, the requirements made of the surface quality of the heat sink 15 are low since the heat spreading via the relatively large second main area 1b of the carrier 1 is good and allows mounting by means of an adhesive 16. That is to say that the carrier 1 serves for the heat spreading of the heat generated by the semiconductor chip 2 during operation and is emitted to the heat sink 15 over a particularly large area via the second main area 1b, such that the thermal linking between heat sink 15 and carrier 1 need not be particularly good. Instead of solder mounting, for example, the carrier 1 can therefore also be adhesively bonded onto the heat sink 15. The device furthermore comprises connection locations 14 via which the device can be externally contact-connected. The connection locations 14 are electrically conductively connected by means of bonding wires 17 to the contact metallizations 3a, 3b at the first main area 1a of the carrier. The optoelectronic component, that is to say carrier and semiconductor chip 2, can be potted by means of a potting body 11, which is also in direct contact with the housing base body 12 and the heat sink 15. The optoelectronic component 100 can therefore be potted in the manner of a conventional optoelectronic semiconductor chip in the cavity 13 of the housing base body.

In conjunction with the schematic sectional illustration in FIG. 6, a further exemplary embodiment of an optoelectronic device described here is explained in greater detail. In contrast to the exemplary embodiment in FIG. 5, the bonding wires 17 are omitted here. The contact-connection between the semiconductor chip 2 and the connection locations 14 of the device is effected, for example, via plated-through holes, as described in greater detail in conjunction with FIGS. 1 and 2. In the present case, the electrically conductive material 6 of the plated-through holes is exposed at the side areas 1c of the carrier 1, as explained in greater detail for example in conjunction with FIG. 2. Overall, in comparison with the wire contact-making in FIG. 5, a particularly flat and reliable design is realized in this way.

In conjunction with the flow diagrams in FIGS. 7A, 7B, 7C, 7D, different variants of process sequences for producing an optoelectronic component described here are explained in greater detail. In conjunction with FIGS. 8A, 8B, 8C, 8D, on the basis of schematic sectional illustrations, individual method steps of the method described here are illustrated schematically.

Figure 7A:
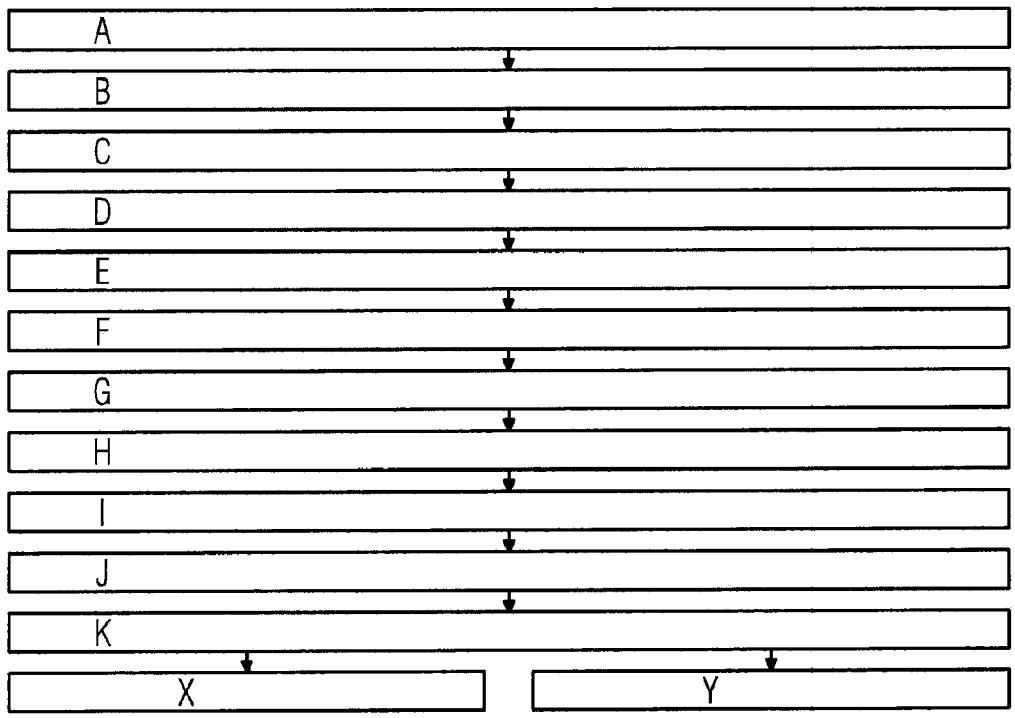

In accordance with the process sequence as described in FIG. 7A, the method comprises the following steps:

A: Firstly, an active layer sequence 21 is provided on a substrate 20 (in this respect, also see FIG. 8A). The active layer sequence 21 is, for example, an epitaxially produced active layer sequence comprising at least one active layer for detecting or for generating electromagnetic radiation. The active layer sequence 21 is deposited epitaxially for example onto a growth substrate 20.

B: In a subsequent method step, a reflective layer can be produced on that side of the active layer sequence 21 which faces away from the substrate 20, said reflective layer serving as a mirror. Furthermore, it is possible to produce passivations serving, for example, for defining contact locations of the later semiconductor chips 2.

C: The active layer sequence 21 can then be singulated into individual segments which later constitute the semiconductor chips 2.

D: Subsequently, a solder layer can be applied to that side of the active layer sequence 21 which faces away from the substrate 20.

E: In a subsequent method step, the individual segments, that is to say the chips, are transferred to an auxiliary carrier 22, for example by means of a connecting material 23; in this respect, also see FIG. 8B. Subsequently, the substrate 20 is detached from the active layer sequence 21; in this respect, cf. FIG. 8C.

F: Top side contacts of the semiconductor chip 2 are produced on the side of the active layer sequence 21 from which the substrate 20 has been removed.

G: The functional checking of the optoelectronic semiconductor chips follows in this step. In the present case, the functional checking is effected on the auxiliary carrier 22. During the functional checking, an electrical-optical characterization of the semiconductor chips 2 takes place, such that the latter can subsequently be sorted in accordance with their physical properties. That is to say that a wafer mapping takes place, during which the individual semiconductor chips 2 are classified into individual classes (so-called bins).

H: In the next method step, the mounting of the semiconductor chips 2 on a carrier assemblage comprising a multiplicity of carriers 1 takes place; also cf. FIG. 8D.

I: Subsequently, the top side contacts of the semiconductor chips 2 are contact-connected for example by metallizations and subsequent phototechnology.

J: If appropriate, the application of a conversion element 9 and/or the potting with a potting body 11 are/is then effected.

K: The carrier assemblage comprising a multiplicity of carriers 1 is singulated along the side areas 1c of the carriers 1 to form individual optoelectronic components 100. This gives rise to a finished surface-mountable device as illustrated for example in conjunction with FIGS. 1, 2, 3 and 4 (step X), or the component is mounted into a housing base body, as shown for example in conjunction with FIGS. 5 and 6 (step Y).

Figure 7B:
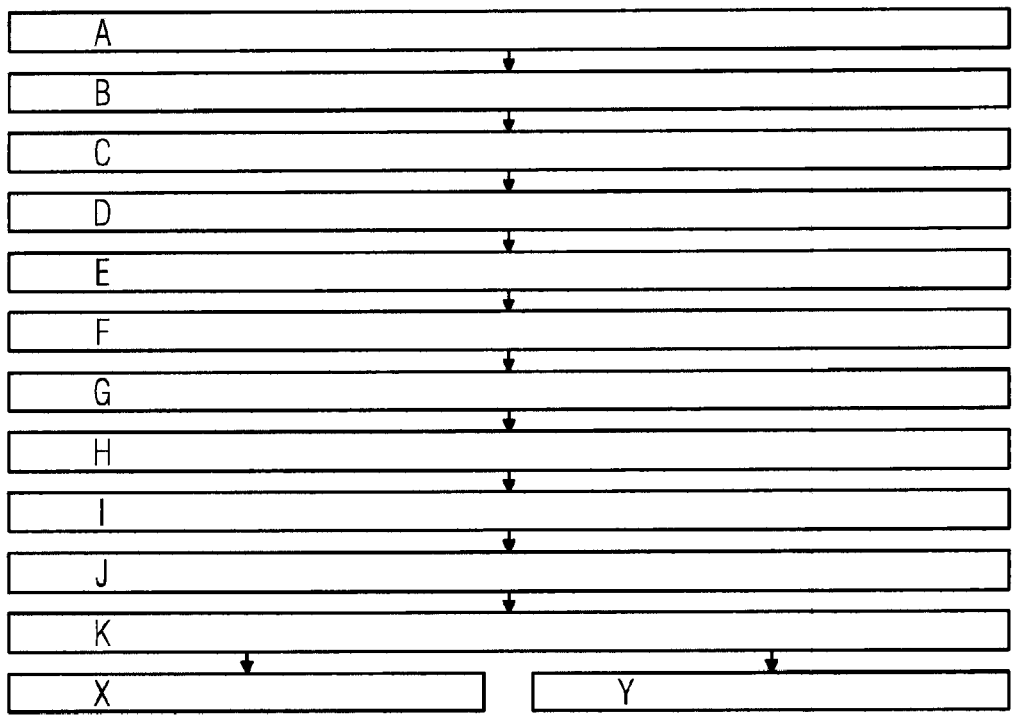

An alternative process sequence is described in conjunction with FIG. 7B. In contrast to the process sequence described in conjunction with FIG. 7A, the process steps D and C are interchanged there. That is to say that the solder layer is applied before the active layer sequence 21 is singulated into individual segments.

Figure 7C:
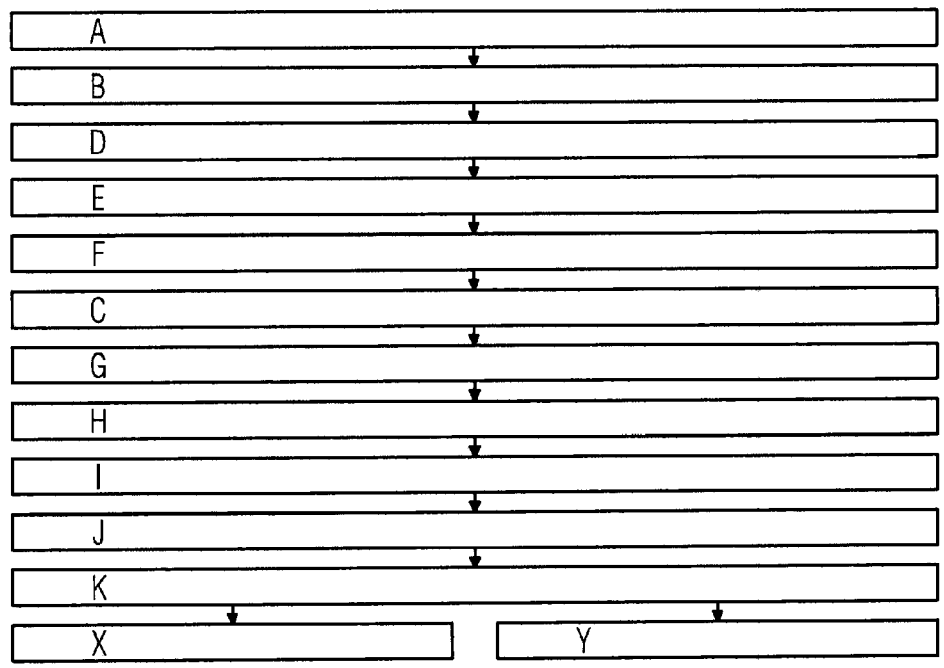

A further variant of a process progression for a production method described here is explained in greater detail in conjunction with FIG. 7C. In contrast to the process sequence described in conjunction with FIG. 7B, the singulation of the active layer sequence 21 into individual segments in process step C is effected here after process step F, that is to say after the production of top side contacts. In this case, therefore, the position of the later semiconductor chips 2 can be defined by means of the top side contacts.

Figure 7D:
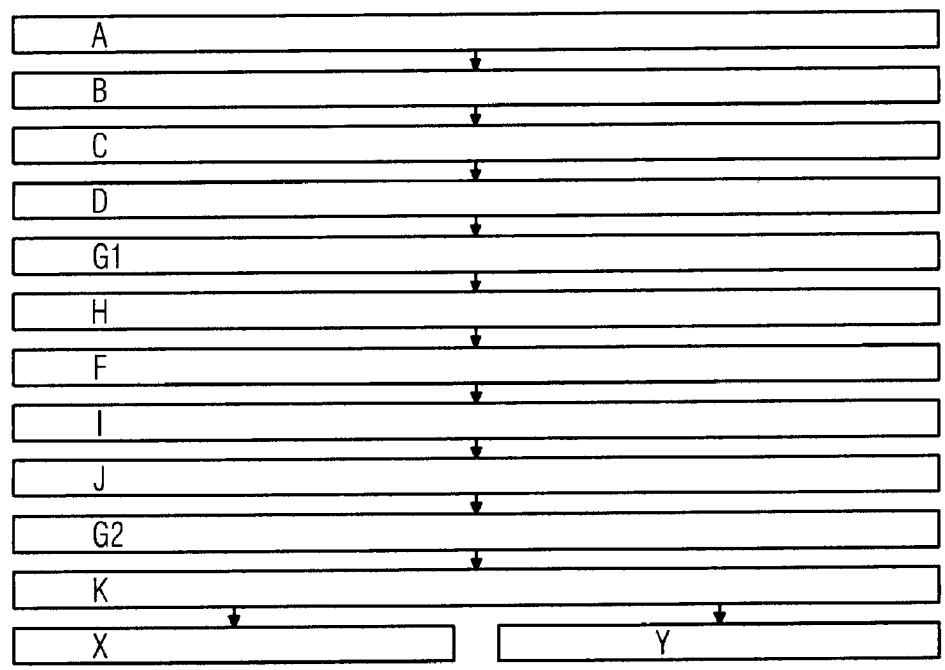
Figure 8A:
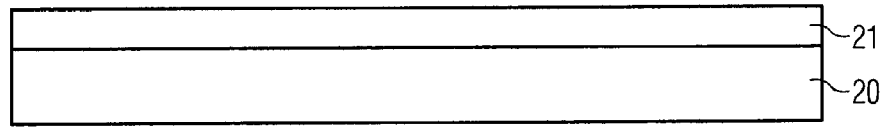
Figure 8B:
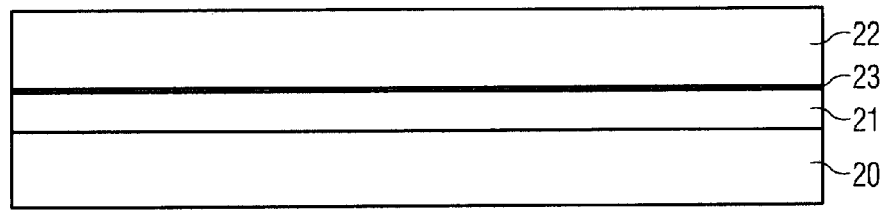
Figure 8C:
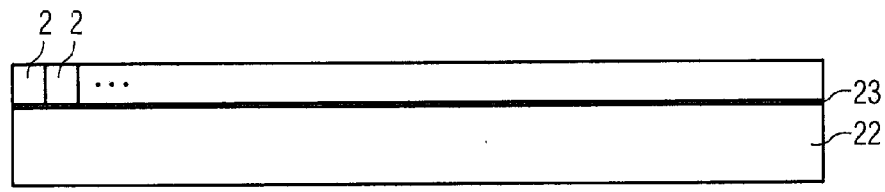
Figure 8D:
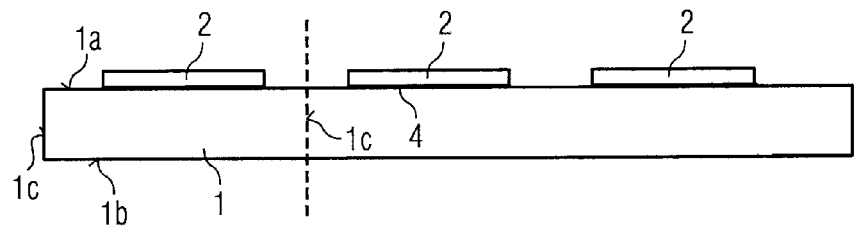

A further variant of a production method described here is explained in greater detail in conjunction with FIG. 7D. The process sequence described in conjunction with FIG. 7D describes a method in which an auxiliary carrier 22 is dispensed with. That is to say that method step E is omitted. After method step D (applying the solder layer), an electrical-optical characterization of the light-active elements still applied to the substrate 20 is effected (method step G1). In method step H, the light-active elements, that is to say the later semiconductor chips 2, are mounted on the carrier assemblage comprising a multiplicity of carriers 1 by separation from the substrate 20.

In method step G2, which can be carried out for example after the application of a conversion element 9 or a potting element 11 in method step J, a further electrical-optical characterization of the semiconductor chips 2 already mounted onto the carrier 1 is effected before the carrier assemblage comprising a multiplicity of carriers 1 is singulated into individual optoelectronic components 100.

Figure 9:
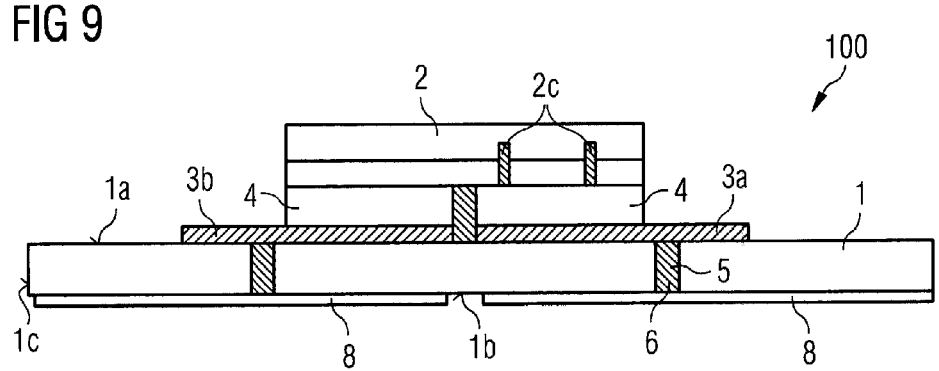

In conjunction with FIG. 9, on the basis of a schematic sectional illustration, a further exemplary embodiment of an optoelectronic component 100 described here is explained in greater detail. In contrast to the exemplary embodiment described in conjunction with FIG. 1, the optoelectronic semiconductor chip 2 in the exemplary embodiment in FIG. 9 is embodied as a surface-mountable semiconductor chip with internal contact distribution. That is to say that the chip 2 comprises plated-through holes 2c through which the semiconductor chip can be contact-connected on the n-side, for example. In this case, the plated-through holes 2c penetrate through, for example, the p-doped layers and the active zone of the semiconductor chip 2. It is equally conceivable, however, for the plated-through holes 2c to make contact with the p-side of the semiconductor chip 2. The plated-through holes 2c then penetrate through the n-doped regions and the active zone of the semiconductor chip 2. For the rest, the optoelectronic component 100 in FIG. 9 can be embodied as described in conjunction with any of FIG. 1, 2, 3 or 4. The difference then merely consists in the use of a surface-mountable semiconductor chip.

This patent application claims the priority of German patent applications 102009047878.7 and 102009051746.4, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An optoelectronic component comprising:
a carrier, having a first main area;
at least one substrateless optoelectronic semiconductor chip; and
a contact metallization,
wherein the carrier is electrically insulated,
wherein the at least one optoelectronic semiconductor chip is fixed to the first main area of the carrier by means of a connecting material, in particular a solder material,
wherein the contact metallization covers at least one region of the first main area which is free of the optoelectronic semiconductor chip,
wherein the contact metallization is electrically conductively connected to the optoelectronic semiconductor chip;
wherein the at least one optoelectronic semiconductor chip is a surface-mountable semiconductor chip having p-doped layers, n-doped layers and an active zone,
wherein the at least one semiconductor chip comprises plated-throughholes which penetrate through the p-doped layers and the active zone,
wherein the semiconductor chip is contact-connected on an n-side via the plated-throughholes or the plated throughholes penetrate through the n-doped layers and the active zone and the semiconductor chip is contact-connected on a p-side via the plated-throughholes.

2. The optoelectronic component according to claim 1, wherein the carrier has at least one opening extending from the first main area through the carrier to an opposite second main area,
wherein the opening is filled with an electrically conductive material at least in places, and
wherein the electrically conductive material is electrically conductively connected to the contact metallization.

3. The optoelectronic component according to claim 1, wherein
at least one opening is surrounded completely by the carrier in a lateral direction.

4. The optoelectronic component according to claim 1, wherein the electrically conductive material of at least one opening is free of the carrier in a lateral direction.

5. The optoelectronic component according to claim 1, wherein at least one component connection is arranged at the second main area of the carrier, wherein the component connection is electrically conductively connected to the electrically conductive material in at least one opening.

6. The optoelectronic component according to claim 1, comprising:
at least two optoelectronic semiconductor chips of identical type, which are fixed to the first main area of the carrier, and
at least one conversion element which covers the optoelectronic semiconductor chips of identical type at their side remote from the first main area.

7. The optoelectronic component according to claim 6, wherein the conversion element covers an interspace between two adjacent optoelectronic semiconductor chips of identical type.

8. The optoelectronic component according to claim 1, comprising:
a potting body, which molds around the optoelectronic semiconductor chip at least in places, wherein
the potting body adjoins the first main area of the carrier, and
at least one side area of the potting body terminates flush with at least one side area of the carrier.

9. An optoelectronic device comprising:
a housing base body, and
at least one optoelectronic component according to claim 1, wherein the optoelectronic component is fixed in or to the housing base body.

10. The optoelectronic device according to claim 9, wherein
a potting body is molded around the optoelectronic component at least in places, wherein the potting body adjoins the carrier, the optoelectronic semiconductor chip and the housing base body.

11. The optoelectronic component according to claim 1, wherein a reflecting potting material surrounds the at least one optoelectronic semiconductor chip all around in a lateral direction, wherein the reflective potting material completely covers the first main area of the carrier, and wherein only a top side of the optoelectronic semiconductor chip facing away from the carrier is free of the reflective potting material.

12. The optoelectronic component according to claim 11, wherein the reflective potting material completely covers the contact metallization such that the contact metallization is not discernible in a plane view of the optoelectronic component.

13. An optoelectronic component comprising:
a carrier, having a first main area;
at least two substrateless optoelectronic semiconductor chips of identical type, which are fixed to the first main area of the carrier;
at least one conversion element which covers the optoelectronic semiconductor chips of identical type at their side remote from the first main area; and
a contact metallization,
wherein the carrier is electrically insulated,
wherein the at least one optoelectronic semiconductor chip is fixed to the first main area of the carrier by means of a connecting material, wherein the contact metallization covers at least one region of the first main area which is free of the optoelectronic semiconductor chip, wherein the contact metallization is electrically conductively connected to the optoelectronic semiconductor chip, wherein the conversion element covers an interspace between two adjacent optoelectronic semiconductor chips of identical type, and wherein said connecting material is solder material.

14. An optoelectronic component comprising:

a carrier, having a first main area;

at least two substrateless optoelectronic semiconductor chips of identical type, which are fixed to the first main area of the carrier;

at least one conversion element which covers the optoelectronic semiconductor chips of identical type at their side remote from the first main area; and a contact metallization, wherein the carrier is electrically insulated, wherein the at least one optoelectronic semiconductor chip is fixed to the first main area of the carrier by means of a connecting material, wherein the contact metallization covers at least one region of the first main area which is free of the optoelectronic semiconductor chip, wherein the contact metallization is electrically conductively connected to the optoelectronic semiconductor chip, wherein the conversion element covers an interspace between two adjacent optoelectronic semiconductor chips of identical type, and wherein a reflecting potting material surrounds the at least one optoelectronic semiconductor chip all around in a lateral direction, wherein the reflective potting material completely covers the first main area of the carrier, and wherein only a top side of the optoelectronic semiconductor chip facing away from the carrier is free of the reflective potting material.

15. The optoelectronic component according to claim 14, wherein the reflective potting material completely covers the contact metallization such that the contact metallization is not discernible in a plane view of the optoelectronic component.

16. The optoelectronic component according to claim 14, wherein the conversion element covers the optoelectronic semiconductor chips of identical type only at a side remote from the first main area, and the conversion element is a lamina consisting of a ceramic luminescence conversion material which spans the interspace between the adjacent semiconductor chips.

* * * * *